(12) United States Patent
Pio

(10) Patent No.: US 6,815,328 B2
(45) Date of Patent: Nov. 9, 2004

(54) METHOD OF MANUFACTURING AN INTEGRATED SEMICONDUCTOR DEVICE HAVING A PLURALITY OF CONNECTION LEVELS

(75) Inventor: Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 33 days.

(21) Appl. No.: 10/001,625

(22) Filed: Oct. 24, 2001

(65) Prior Publication Data

US 2002/0055249 A1 May 9, 2002

Related U.S. Application Data

(62) Division of application No. 09/405,506, filed on Sep. 23, 1999.

(30) Foreign Application Priority Data

Sep. 25, 1998 (EP) ............................................. 98830562

(51) Int. Cl.[7] ..................... H01L 21/4763; H01L 23/48
(52) U.S. Cl. ..................... 438/618; 438/622; 438/624; 438/625; 438/629; 438/636; 438/637; 257/758; 257/759; 257/760
(58) Field of Search ................................. 438/624, 724, 438/744, 636–638, 666, 668, 618, 625, 629, 233, 631, 641, 702, 740, 672–675, 622, 623, 634, 642, 652, 240; 257/758–760, 642, 643, 773, 246, 303, 308, 208, 201

(56) References Cited

U.S. PATENT DOCUMENTS

| | | | |
|---|---|---|---|
| 5,328,553 A | 7/1994 | Poon | 156/636 |
| 5,710,462 A | 1/1998 | Mizushima | 257/758 |
| 5,717,251 A | 2/1998 | Hayashi et al. | 257/58 |
| 5,760,429 A | 6/1998 | Yano et al. | 257/211 |
| 5,773,314 A * | 6/1998 | Jiang et al. | 438/3 |
| 5,834,845 A | 11/1998 | Stolmeijer | 257/752 |
| 5,854,515 A * | 12/1998 | Bandyopadhyay et al. | 257/775 |
| 5,891,799 A * | 4/1999 | Tsui | 438/624 |
| 5,990,507 A * | 11/1999 | Mochizuki et al. | 257/295 |
| 6,130,449 A * | 10/2000 | Matsuoka et al. | 257/296 |
| 6,150,721 A | 11/2000 | Bandyopadhyay et al. | 257/758 |
| 6,165,839 A * | 12/2000 | Lee et al. | 438/253 |
| 6,165,880 A * | 12/2000 | Yaung et al. | 438/592 |
| 6,239,491 B1 * | 5/2001 | Pasch et al. | 257/750 |
| 6,448,651 B1 * | 9/2002 | Kim | 257/758 |

FOREIGN PATENT DOCUMENTS

| | | |
|---|---|---|
| FR | 2754391 | 4/1998 |
| WO | WO97/11488 | 3/1997 |

OTHER PUBLICATIONS

S. Wolf et al., Silicon Processing for the VLSI Era, VOL 1–Process Technology, pp 280–283.*

* cited by examiner

*Primary Examiner*—Donghee Kang
(74) *Attorney, Agent, or Firm*—Lisa K. Jorgenson; Robert Iannucci; Seed IP Law Group PLLC

(57) ABSTRACT

An integrated device comprises a first conductive region and a first insulating region of dielectric material covering the first conductive region. A first through region of electrically conductive material extends inside the first insulating region, and is in direct electrical contact with the first conductive region. A second conductive region, arranged above the first insulating region, is in a position not aligned and not in contact with the first through region. A second insulating region of dielectric material covers the second conductive region. A second through region of electrically conductive material extends inside the second insulating region as far as the first through region and is aligned and in direct electrical contact with the first through region. A third conductive region, arranged above the second insulating region, is aligned and in direct electrical contact with the second through region.

26 Claims, 4 Drawing Sheets

METHOD OF MANUFACTURING AN INTEGRATED SEMICONDUCTOR DEVICE HAVING A PLURALITY OF CONNECTION LEVELS

CROSS-REFERENCE TO RELATED APPLICATION

This application is a divisional of U.S. patent application Ser. No. 09/405,506, filed Sep. 23, 1999.

BACKGROUND OF THE INVENTION

1. Field of the Invention

The present invention relates to an integrated semiconductor device having a plurality of connection levels, and a manufacturing method thereof.

2. Description of the Related Art

As known, the integration of semiconductor devices is always and always increasing, because of the progresses in the semiconductor technology. In particular, the availability of a plurality of metal layers for interconnections has been decisive in making the signal routing more compact.

In devices having a plurality of connection levels (layers of metal or another conductive material), electrical connections exist between connection regions formed in successive connection levels, and between connection levels formed in the first connection level and regions integrated in the device substrate; these connections are formed by through regions (plugs or contacts) extending through the insulating material separating the various connection levels from one another, and from the integrated regions of the device. In addition, connections are sometimes present between connection regions belonging to non-consecutive connection levels, for example between an (N−1)-th metal layer and an (N+1)-th metal layer, or between integrated regions and connection regions that do not belong to the first metal level. In this case, now, it is necessary to form intermediate regions or islands in the intermediate connection layer (for example the N-th metal layer).

An example of connection between a connection region formed in the third level (third metal layer) and a connection region formed in the first level (first metal layer) is shown in FIGS. 1a and 1b, which show respectively a top plan view and a cross-section of a device 1. The device 1 comprises a substrate 3 of a first conductivity type (for example P), accommodating an integrated region 4 of a second conductivity type (for example N). On substrate 1 there extend in succession a first dielectric layer 5, a first metal level 6, a second dielectric layer 7, a second metal level 10, a third dielectric layer 9, and a third metal level 11.

The first metal layer 6 comprises a first connection region 6a; the second metal layer 10 comprises second connection regions 10a, and the third metal layer 11 comprises a third connection region 11a. The first connection region 6a is connected to the integrated region 4 by a contact 12, which extends through the first dielectric layer 5; in addition, the first connection region 6a is connected to the third connection region 11a by an intermediate region or "island" 10b, which is formed in the second metal level 10. The intermediate island 10b is connected to the first connection region 6a by a first plug 15 passing through the second dielectric layer 7, and it is connected to the third connection region 11a by a second plug 16 passing through the third dielectric layer 9.

The manufacture of the intermediate island 10b involves a certain bulk, since it is necessary to comply with rules regarding the width of the intermediate island (which is therefore wider than plugs 15, 16), and the minimum distance from the regions (connection regions 10b) formed on the same metal level. It is apparent that when different connections must be provided between connection and/or integrated regions belonging to non-adjacent levels, this results in a considerable spatial dimension. In addition, sometimes, the space required by the intermediate islands does not allow the device layout to be optimized. This is the case for example of non-volatile EPROM, EEPROM and flash-EEPROM memories, wherein it is required to connect all, or a large number, of polysilicon control gate regions on the first metal level ("word line strap"), and the drain regions on the same bit line on the second metal level to reduce the capacitive connection between the second metal level and the substrate, and thus the parasitic capacities.

SUMMARY OF THE INVENTION

An object of the invention is to provide a solution allowing a reduction in the space necessary for connecting two connection regions, or a connection region and an integrated region of the device, arranged on non-consecutive levels.

According to principles of the present invention, an integrated semiconductor device having a plurality of connections levels and a manufacturing method thereof are provided.

To help understanding of the present invention, preferred embodiments are now described, purely by way of non-limiting example, with reference to the attached drawings.

DETAILED DESCRIPTION OF THE INVENTION

Figures 1A, 1B, 2A, 2B:
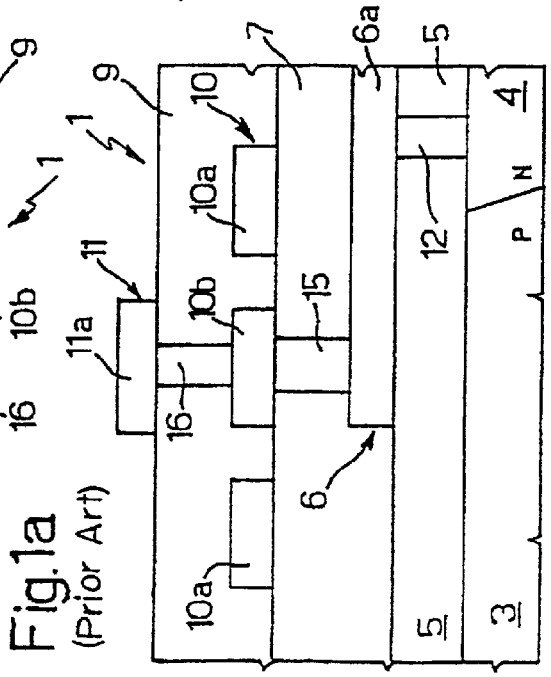
FIG. 1A shows a top plan view of a known device.
FIG. 1B shows a cross-section through the known device of FIG. 1.
FIG. 2A shows a top plan view of a device according to the invention.
FIG. 2B shows a cross-section through the device of FIG. 2A.
Figure 3:
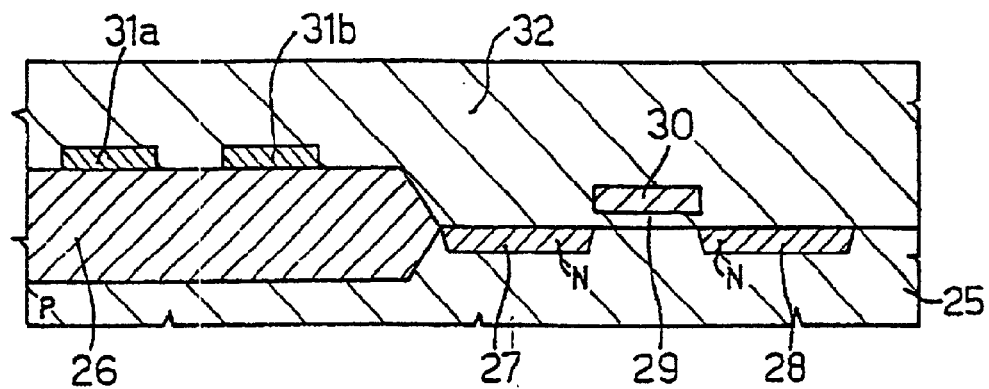
FIGS. 3–8 show cross-sections through a second embodiment relating to a memory device, in successive manufacturing steps.

In FIGS. 2A, 2B, the parts of the integrated device 20 in common with the known device 1 of FIGS. 1A and 1B, are shown with the same reference numbers, and will not be described again.

In detail, in device 20, the intermediate island 10b of the conventional semiconductor device 1 is not present, and a second plug 21 passing through the third dielectric layer 9 extends as far as the first plug 15, and is in direct contact with the latter for connection to the first connection region 6a.

As can be seen, plugs 15, 21 have cross dimensions that are substantially constant and equal to each other. The entire connection structure between the third connection region 11a and the first connection region 6a has a much smaller dimension than the solution of FIG. 1B because of the lack of the intermediate island 10b. As already stated, according to the existing integration rules the intermediate island 10b should be much wider than the plugs.

In general, the cross dimensions of plugs 15, 21, and the provided tolerances, are such as to ensure electrical continuity between the plugs 15, 21, even in case of misalignment of the etching masks of the second and third dielectric layers 7, 9. It will be appreciated that the contact area is reduced as the misalignment increases. However, the metal forming the plugs 15, 21 guarantees the electrical continuity. Of course, the dimensions must be designed so that misalignment does not jeopardize the electrical insulation between the plug 21 and the second connection regions 10a. The distance required to guarantee, this insulation is however less than the dimensions obtainable photolithographically, such that in any case, elimination of the intermediate islands involves reduction of the dimensions.

To manufacture the device 20, the intermediate island 10b is not formed during shaping of the second metal level 10. Additionally, etching of the third dielectric layer 9 is prolonged such as to additionally remove the dielectric layer to a depth equivalent to the thickness of the second metal level 10, such as to reach the first plug 15. Although etching of the dielectric layer 9 is carried out for a greater thickness than in case of device 1 (FIGS. 1A, 1B), this will not present a problem because the selectivity of etching between the dielectric material and the metal material is high. Thus, it is possible to prolong etching without damaging the connection regions where connection apertures are simultaneously formed.

To avoid damaging the lower dielectric layer, in this specific case layer 7, where there is misalignment of the etching masks of the third dielectric layer 9 with respect to the second dielectric layer 7, the second dielectric layer can be formed from two superimposed layers with different etching characteristics. Consequently, the two superimposed layers can be selectively removed. In this case, etching of the third dielectric layer 9 stops automatically at the second dielectric layer 7.

An embodiment of a process for electrically connecting a drain region of a floating gate, non-volatile memory element to a second metal level, is now described with reference to FIGS. 3–8. The process uses two dielectric layers, as previously described.

In detail, the manufacturing method starts with conventional steps typical of a MOS process, as far as depositing and planarizing a first insulating layer of dielectric material. In the example shown in FIG. 3, a structure is illustrated as having a substrate 25 of P-type and a field oxide region 26. A drain region 27 and a source region 28 of N-type is obtained by selectively introducing doping ion species into the substrate 25. A gate oxide region 29 is arranged on substrate 25, as well as a gate region 30. Conductive polysilicon regions 31a, 31b are formed on field oxide region 26. Lastly, there is a first insulating layer 32, typically of silicon oxide $SiO_2$, having a thickness of, for example, approximately 500 nm. First insulating layer 32 can optionally be formed in two different steps. For example, depositing TEOS (TetraEthylOrthoSilicate), and/or SOG (Spin On Glass), and/or BPSG (Boron Phosphorous Silicon Glass). Preferably, the first insulating layer 32 is planarized through a reflow step, and then through CMP (chemical mechanical polishing), to guarantee optimum planarization of the surface.

Figure 4:
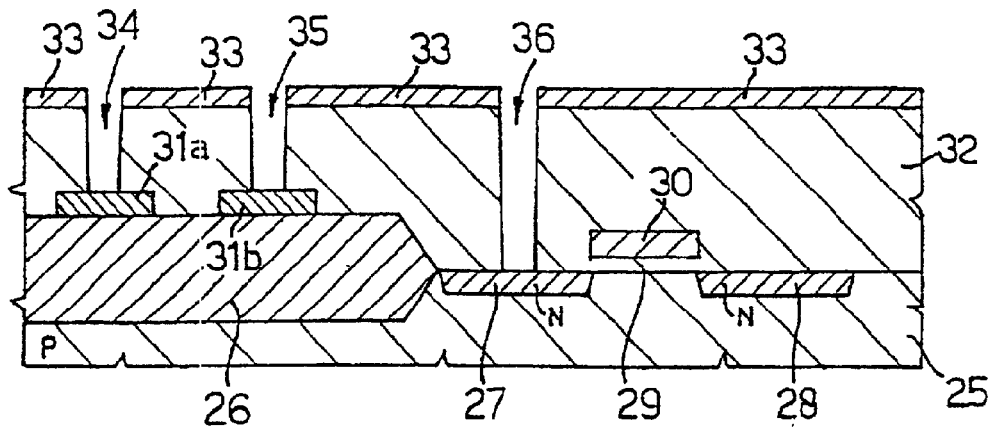

Subsequently, on the first insulating layer 32, which is already planarized, a first stop layer 33 of dielectric material, for example, silicon nitride, is deposited with a thickness of, for example, approximately 50 nm. A contact etching mask is formed on the first insulating layer 32, and contacts are opened through the first stop layer 33 and the first insulating layer 32, using first an etching solution permitting removal of silicon nitride of the first stop layer 33, and then an etching solution removing silicon oxide of the first insulating layer 32. After removing the contact etching mask, the structure of FIG. 4 is obtained, where apertures 34, 35 extend as far as conductive polysilicon regions 31a, 31b, and an aperture 36 extends as far as drain region 27.

Figure 5:
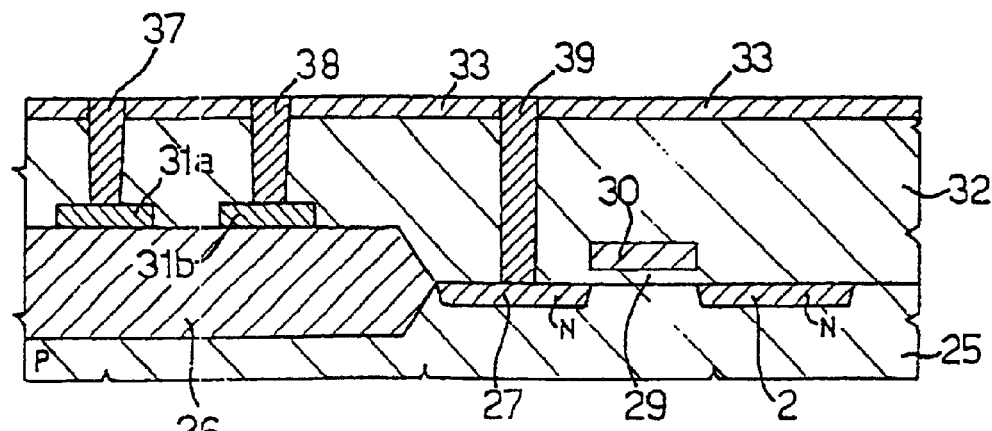
Figure 6:
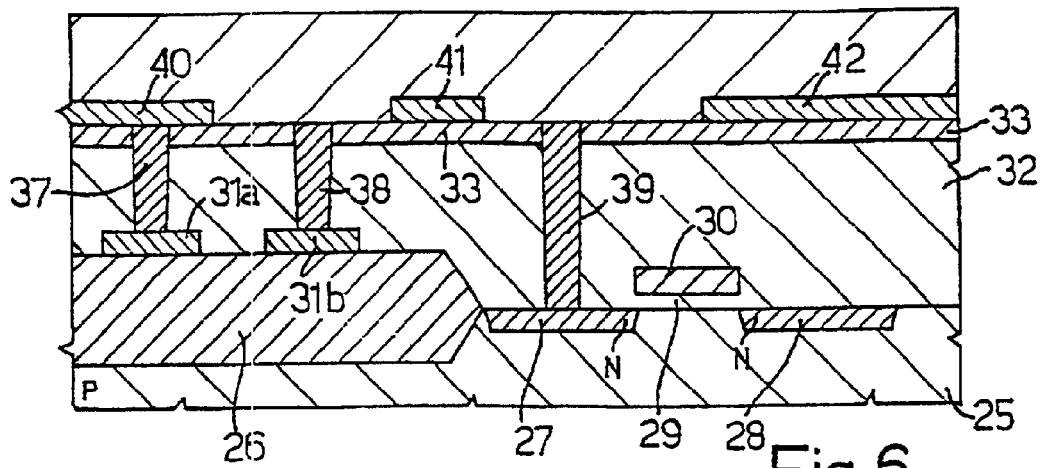

Apertures 34, 35, 36 are then filled with a conductive material, such as tungsten after any steps of cleaning and depositing a barrier layer, such as titanium nitride (not shown). For example, a filling layer is deposited, and an etch-back step is carried out, for removing the filling layer above the first stop layer 33. Consequently, the filling material remains only inside apertures 34, 35, 36, forming plugs 37, 38, 39, as shown in FIG. 5.

Subsequently, a first metal material layer, for example, aluminum or copper is deposited. The first metal material layer, which forms the first metal level, is then defined to form connection regions according to the design. In particular, three connection regions 40, 41, 42 are, shown in FIG. 6, where connection region 40 is in electrical contact with plug 37. Intermediate islands, such as 10b shown in FIG. 1B, are not formed in this step.

Figure 7:
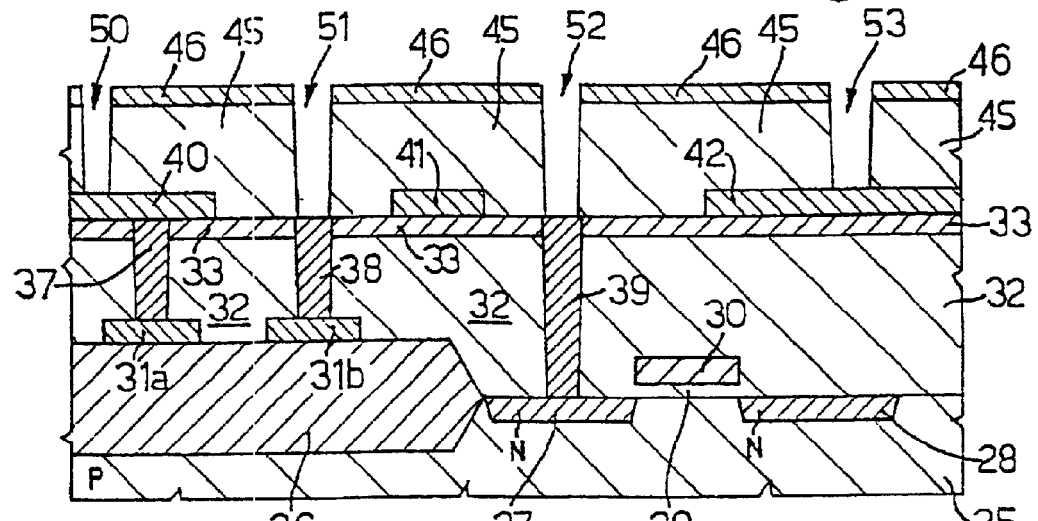

A second insulating layer 45, typically of $SiO_2$, is then formed, similarly to the first insulating layer 32. The second insulating layer 45 is planarized by reflow and CMP. A second stop layer 46, typically of silicon nitride, is then deposited. Then, using a second mask and double RIE (Reactive Ion Etching) with two different chemicals, apertures 50, 51, 52 and 53 are formed, which pass through the second stop layer 46 and second insulating layer 45. As shown in FIG. 7, aperture 50 ends at the connection region 40 of the first metal level, aperture 51 ends at plug 38, aperture 52 ends at plug 39, and aperture 53 ends at connection region 42 of the first metal level.

Figure 8:
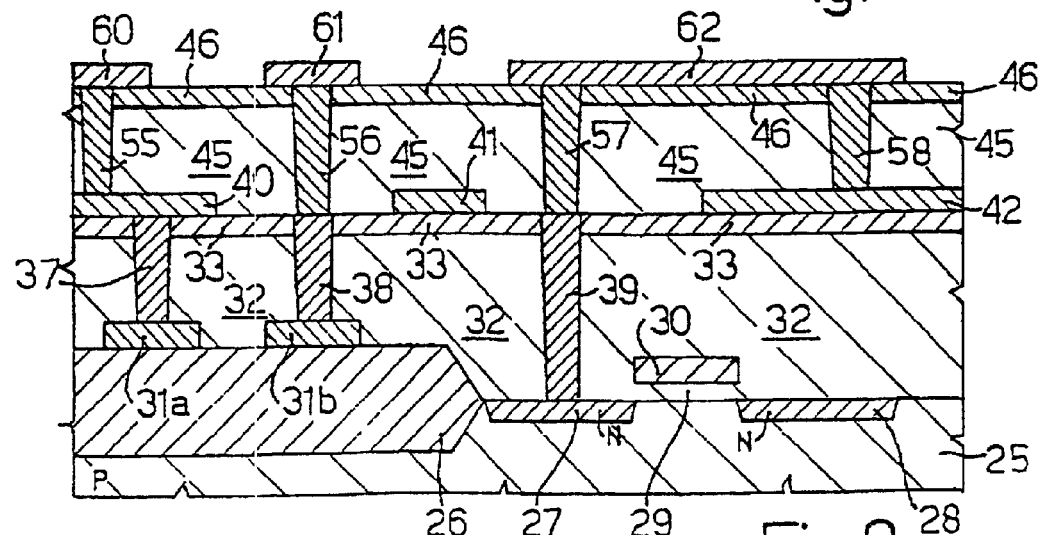

Subsequently, and similarly to the apertures 34, 35, 36 shown in FIG. 4, apertures 50–53 are filled with conductive material, typically tungsten, after any steps for cleaning and depositing a barrier layer, by depositing a filling layer and etching back. Thus, on completion, plugs 55, 56, 57 and 58 are formed inside apertures 50–53, as shown in FIG. 8. In particular, plug 56 is aligned and in direct electrical contact with plug 38, and plug 57 is aligned and in direct electrical contact with plug 39.

A second metal material layer, for example, aluminum or copper, is then deposited and defined to form the second metal level. Three connection regions 60, 61, 62 are then formed, where connection region 60 is in electrical contact with plug 55, connection region 61 is in electrical contact with plug 56, and connection region 62 is in electrical contact with both plug 57 and plug 58. Thereby, connection region 61 is in electrical contact with connection region 31b, and connection region 62 is in electrical contact with drain region 27, without requiring intermediate islands on the first metal level. This allows for, among other things, arranging connection region 41 as shown, whereas forming intermediate islands between plugs 56, 38, and 57, 39, is not possible, or would require greater space between connection regions 61 and 62.

Figure 9:
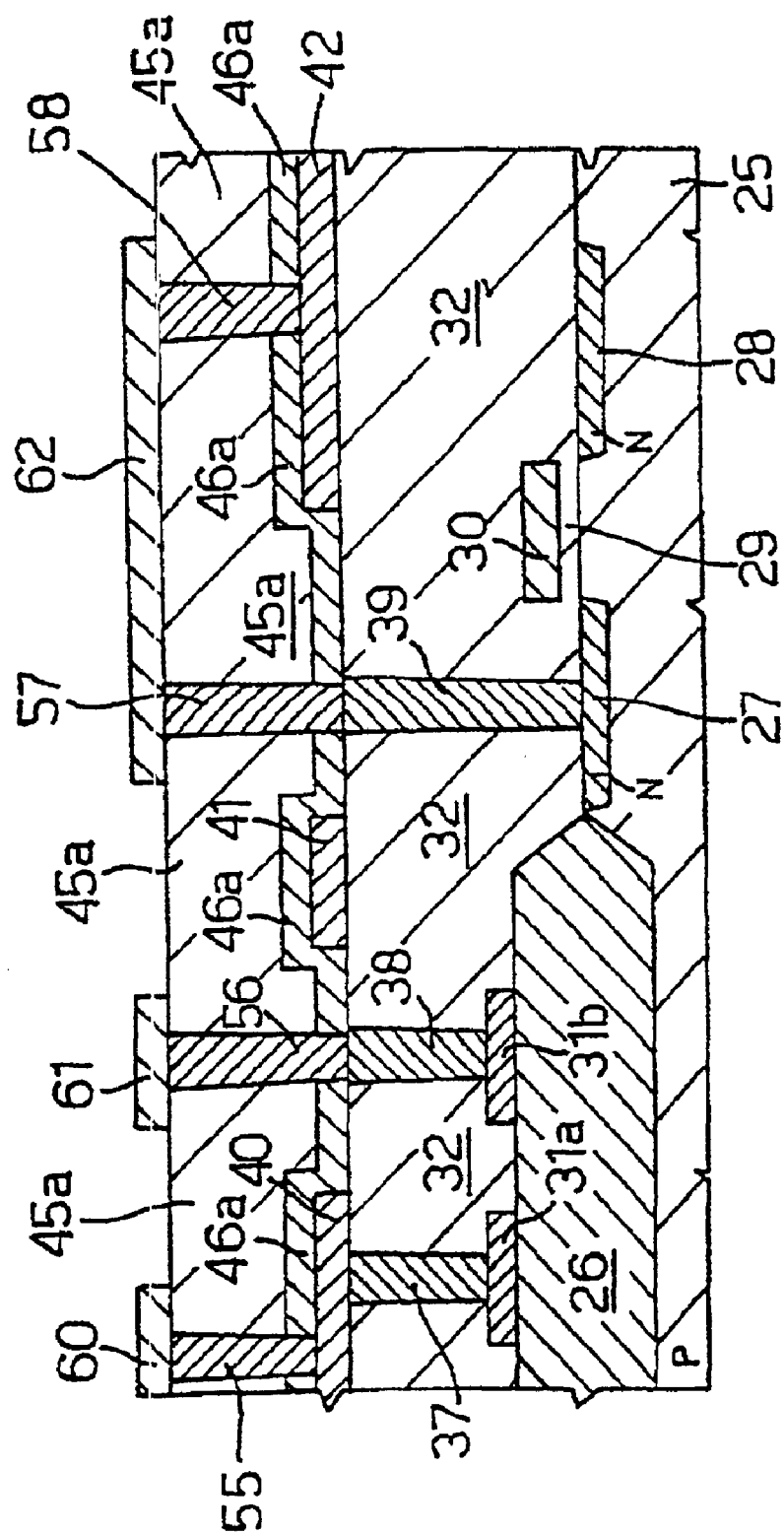
FIG. 9 shows a cross-section through a third embodiment of the invention.

FIG. 9 shows a variant of FIG. 8, wherein connection regions 40 and 42 of the first metal level are protected from over-etching when forming stacked plugs 56, 57. In fact, as already stated, over-etching, which is necessary to form the plugs 56, 57, in general does not significantly damage the connection regions 40, 42, where the apertures 50, 53 are formed, by virtue of selectivity of metal with respect to connection region etching. However, to minimize damage to the metal in several conditions, it is possible to protect these connection regions, 40, 42 by first depositing the stop layer and then the inter-metallic dielectric layer, which prevents breakdown. This solution is shown in FIG. 9, wherein the parts common to FIG. 8 have the same reference numbers. In detail, a second stop layer 46a is disposed directly above the first metal level, including connection regions 40–42, and is open only at the plugs 56–58 The second dielectric layer 45a extends above. Consequently, first stop layer 33 is no longer necessary. However, optionally, and similarly to layers 45a, 46a, a silicon nitride stop layer can be arranged below the first dielectric layer 32 of oxide, in a manner not shown in FIG. 9.

For manufacturing the device of FIG. 9, after the first level connection regions 40–41 have been defined, first the second stop layer 46a, for example, of nitride, and then the second dielectric layer 45a, for example, of oxide, are deposited. Subsequently, the apertures 50–53 are formed by carrying out initial RIE with a first etching chemical, to selectively remove oxide of the second dielectric layer 45a. This step includes an over-etching as necessary in order to excavate the greater depth at the plugs 38, 39, and is stopped automatically at the second stop layer 46a. A second RIE step is then carried out with a second etching chemical, in order to selectively remove nitride of the second stop layer 46a, for a time correlated to the thickness of second stop layer 46a. Thereby, the second connection regions 40, 42 are protected by the second stop layer 46a during over-etching necessary to form plugs 56, 57.

The advantages of the described device and the method are the followings. First, the bulk for connecting connection and/or integrated regions arranged on non-adjacent levels is reduced. In addition, the described method comprises only known process steps and can therefore be implemented using equipments commonly used in the microelectronics industry. The method is simple and reliable, and does not create problems of implementation. Ii a double dielectric layer is used, as shown in the embodiment of FIGS. 3–8, it is possible to carry out slight over-etching of the upper dielectric layer, that is the second insulating layer 45. Thus, this ensures that the apertures, that is the apertures 50–53, are formed correctly. Even if the etching masks are misaligned, etching of an upper insulating layer, that is, upper insulating layer 45, stops automatically at the underlying stop layer, that is, the first stop layer 33.

Finally, it is apparent that many modifications and variants can be made to the device and method described and illustrated here, all of which come within the scope of the invention, as defined in the attached claims. In particular, it is emphasized that the described structure can be applied to devices of a different type, as long as they comprise at least two metal levels. In addition, in general, it allows connection between a metal level N−1 and a metal level N−1, thus eliminating the intermediate islands on metal level N. The described solution can also be replicated on additional, upper metal levels such as to obtain a plurality of apertures and plugs stacked one on another, for as much as 3 or 4 levels. Any method for planarizing the insulating layer can be used, for example may not include CMP. The dielectric stop layer can be provided on only some levels or on none of them, if the manufacturing method used guarantees a high level of alignment of the masks.

What is claimed is:

1. A method for manufacturing an integrated semiconductor device, having a plurality of connection levels, comprising:

forming a first conductive region above a substrate of semiconductor material;

forming a first insulating region of dielectric material above the first conductive region;

forming a first through region of electrically conductive material inside the first insulating region, and in direct electrical contact with the first conductive region;

forming a second conductive region above the first insulating region, in a position not aligned and not in contact with the first through region;

forming a second insulating region of dielectric material, covering the second conductive region;

forming, inside the second insulating region, a second through region of electrically conductive material, extending as far as the first through region, aligned and in direct electrical contact with the first through region; and forming, above the second insulating region, a third conductive region aligned and in direct electrical contact with the second through region, wherein the first conductive region is of metal material, a third insulating region extends above the substrate, and the first conductive region extends above the third insulating region.

2. The method according to claim 1 wherein the first and second through regions have a substantially constant cross-sectional dimension.

3. The method according to claim 1 wherein the step of forming the first conductive regions comprises the step of introducing doping ion species inside the substrate.

4. The method according to claim 1 wherein the second and the third conductive regions are formed in successive metal levels.

5. The method according to claim 1 wherein the first insulating region comprises a first insulating layer of a first dielectric material, and a second insulating layer of a second dielectric material, superimposed on each other, the step of forming the first through region comprises, in succession, the steps of etching the second dielectric material with first etching parameters, etching the first dielectric material with second etching parameters, thereby forming a through aperture in the first insulating region, and filling the through aperture with the electrically conductive material.

6. The method according to claim 5 wherein the first dielectric material comprises silicon oxide, and the second dielectric material comprises silicon nitride.

7. A method according to claim 5 wherein the first dielectric material comprises silicon nitride, and the second dielectric material comprises silicon oxide.

8. A method of forming a integrated semiconductor structure having plurality of connection levels, comprising:

forming a first conductive region;

forming a first insulating layer having an upper surface over the first conductive region;

etching a first opening through the first insulating layer to expose a portion of the first conductive region;

forming a first conductive plug that fills the first opening and is electrically coupled to the first conductive region, the first conductive plug having an upper surface extending no further than the upper surface of the first insulating layer;

forming a second insulating layer having an upper surface over the first insulating layer;

etching a second opening through the second insulating layer to expose a portion of the upper surface of the first conductive plug;

forming a second conductive plug that fills the second opening and is electrically coupled to the first conductive plug, the second conductive plug directly contacting the upper surface of the first conductive plug, and further having an upper surface extending no further than the upper surface of the second insulating layer;

forming a third opening through the first insulating layer;

forming a third conductive plug that fills the third opening and has an upper surface extending no further than the upper surface of the first insulating layer, the first and third conductive plugs being formed simultaneously;

forming a fourth opening through the second insulating layer in a position not directly above the third conductive plug;

forming a fourth conductive plug that fills the fourth opening such that none of the fourth conductive plug is aligned with the third conductive plug, the second and fourth conductive plugs being formed simultaneously; and forming a second conductive region over the first insulating layer, the second conductive region directly electrically coupling the third conductive plug to the fourth conductive plug.

9. The method of claim 8 wherein forming the first conductive region comprises implanting a dopant into a substrate over which the first insulating layer is formed.

10. The method of claim 8 wherein forming the first conductive region comprises depositing a semiconductor material prior to forming the first insulating layer.

11. The method of claim 8 wherein forming the first conductive plug comprises:

depositing a conductive layer over the first insulating layer and filling the first opening; and removing the conductive layer over the first insulating layer by polishing to leave conductive material filling the first contact via.

12. The method of claim 8 wherein forming the second insulating layer comprises:

forming a first dielectric layer over the first conductive region; and forming a second dielectric layer over the first dielectric layer.

13. The method of claim 12 wherein forming the second opening comprises etching through the second dielectric layer and subsequently etching through the first dielectric layer.

14. A method for manufacturing an integrated semiconductor device, having a plurality of connection levels, comprising:

forming a first conductive region above a substrate of semiconductor material;

forming a first insulating region on the first conductive region;

forming a first opening completely through the first insulating region, thereby exposing the first conductive region;

forming a first through region by filling the first opening with electrically conductive material to directly contact the first conductive region;

forming a second insulating region on the second conductive region and the first insulating region;

forming a second opening completely through the second insulating region, thereby exposing the first through region;

forming a second through region by filling the second opening with electrically conductive material to directly contact the first through region;

forming, above the second insulating region, a second conductive region aligned and in direct contact with the second through region; and forming a third insulating region on the substrate, wherein the first conductive region extends above the third insulating region.

15. The method according to claim 14 wherein the first and second conductive regions are formed in successive metal levels.

16. The method according to claim 14 wherein the first insulating region comprises a first insulating layer of a first dielectric material, and a second insulating layer of a second dielectric material, superimposed on each other, and the step of forming the first opening comprises selectively etching the second dielectric material with respect to the first dielectric material and then etching the first dielectric material.

17. The method according to claim 16 wherein the first dielectric material comprises silicon oxide, and the second dielectric material comprises silicon nitride.

18. A method according to claim 16 wherein the first dielectric material comprises silicon nitride, and the second dielectric material comprises silicon oxide.

19. A method for manufacturing an integrated semiconductor device, having a plurality of connection levels, comprising:

forming a first conductive region above a substrate of semiconductor material;

forming a first insulating region of dielectric material above the first conductive region;

forming a first through region of electrically conductive material inside the first insulating region, and in direct electrical contact with the first conductive region;

forming a conductive layer on the first insulating region;

etching the conductive layer to remove all of the conductive layer directly above the first through region and simultaneously form a second conductive region in a position not aligned and not in contact with the first through region;

forming a second insulating region of dielectric material, covering the second conductive region;

forming, inside the second insulating region, a second through region of electrically conductive material, extending as far as the first through region, aligned and in direct electrical contact with the first through region;

forming, above the second insulating region, a third conductive region aligned and in direct electrical contact with the second through region;

forming a third through region of electrically conductive material inside the first insulating region and spaced apart from the first through region, the first and third through regions being formed simultaneously;

forming, inside the second insulating region and not directly above the third through region, a fourth through region of electrically conductive material, the second and fourth through regions being formed simultaneously, wherein the second conductive region directly electrically connects the fourth through region to the third through region; and forming a third insulating region on the substrate, wherein the first conductive region extends above the third insulating region.

20. The method according to claim 19, further comprising forming an etch stop layer of a first dielectric material on the second conductive region and the first insulating region; wherein the second insulating region is formed of a second dielectric material different than the etch stop layer, and the second through region is formed through the etch stop layer and the second insulating region.

21. The method according to claim 19, further comprising:

forming, inside the second insulating region, a fifth through region of electrically conductive material, extending as far as the third through region, aligned and in direct electrical contact with the third through region, the second and fifth through regions being formed simultaneously, wherein the second conductive region is spaced apart from and positioned between the second and fifth through regions.

22. A method for manufacturing an integrated semiconductor device, having a plurality of connection levels, comprising:

forming a first conductive region above a substrate of semiconductor material;

forming a first insulating region of dielectric material above the first conductive region;

forming a first through region of electrically conductive material inside the first insulating region, and indirect electrical contact with the first conductive region;

forming a second conductive region above the first insulating region, in a position not aligned and not in contact with the first through region;

forming an etch stop layer of a first dielectric material on the second conductive region and the first insulating region;

forming on the etch stop layer a second insulating region of a second dielectric material different than the etch stop layer;

forming, inside the etch stop layer and the second insulating region, a second through region of electrically conductive material, extending as far as the first through region, aligned and in direct electrical contact with the first through region;

forming, above the second insulating region, a third conductive region aligned and in direct electrical contact with the second through region;

forming a third through region of electrically conductive material inside the first insulating region and spaced apart from the first through region, the first and third through regions being formed simultaneously;

forming, inside the second insulating region, a fourth through region of electrically conductive material, extending as far as the third through region, aligned and in direct electrical contact with the third through region, the second and fourth through regions being formed simultaneously, wherein the second conductive region is spaced apart from and positioned between the second and fourth through regions; and forming a third insulating region on the substrate, wherein the first conductive region extends above the third insulating region.

23. The method according to claim 22, further comprising:

forming, inside the second insulating region and not directly above the third through region, a fifth through region of electrically conductive material, the second and fifth through regions being formed simultaneously, wherein the second conductive region directly electrically connects the fifth through region to the third through region.

24. A method for manufacturing an integrated semiconductor device; having a plurality of connection levels, comprising:

forming a first conductive region above a substrate of semiconductor material;

forming a first insulating region of dielectric material above the first conductive region;

forming a first through region of electrically conductive material inside the first insulating region, and in direct electrical contact with the first conductive region;

forming a second through region of electrically conductive material inside the first insulating region, the first and second through regions being formed simultaneously;

forming a second conductive region above the first insulating region, in a position between and not in contact with the first and second through regions;

forming a second insulating region of dielectric material, covering the second conductive region;

forming, through the second insulating region, a third through region of electrically conductive material, extending as far as the first through region, aligned and in direct electrical contact with the first through region;

forming, through the second insulating region, a fourth conductive region aligned and in direct electrical contact with the second through region, the third and fourth conductive regions being formed simultaneously after forming the second insulating region above the second conductive region;

forming a third insulating region on the substrate, wherein the first conductive region extends above the third insulating region.

25. The method according to claim 24, further comprising forming an etch stop layer of a first dielectric material on the second conductive region and the first insulating region; wherein the second insulating region is formed of a second dielectric material different than the etch stop layer, and the third and fourth through regions are formed through the etch stop layer and the second insulating region.

26. The method according to claim 24 wherein the second insulating region is a single dielectric layer that covers the second conductive region and separates the second conductive region from the third and fourth through regions.

* * * * *

UNITED STATES PATENT AND TRADEMARK OFFICE
CERTIFICATE OF CORRECTION

| | |
|---|---|
| PATENT NO. | : 6,815,328 B2 |
| APPLICATION NO. | : 10/001625 |
| DATED | : November 9, 2004 |
| INVENTOR(S) | : Federico Pio |

Page 1 of 1

It is certified that error appears in the above-identified patent and that said Letters Patent is hereby corrected as shown below:

Column 9
Line 25, "material inside the first insulating region, and indirect electrical contact with the first conductive region;" should read as --material inside the first insulating region, and in direct electrical contact with the first conductive region;--.

Signed and Sealed this

Twenty-ninth Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 6,815,328 B2
APPLICATION NO. : 10/001625
DATED : November 9, 2004
INVENTOR(S) : Federico Pio It is certified that error appears in the above-identified patent and that said Letters Patent is hereby corrected as shown below:

Column 7
Line 62, "forming a second insulating region on the second conductive region and the first insulation region;" should read as --forming a second insulating region on the first conductive region and the first insulating region;--

Signed and Sealed this

Twenty-second Day of May, 2007

JON W. DUDAS
*Director of the United States Patent and Trademark Office*